United States Patent
Willmot et al.

(10) Patent No.: US 9,426,843 B2
(45) Date of Patent: Aug. 23, 2016

(54) ELECTRICAL CONNECTORS

(71) Applicant: ROLLS-ROYCE PLC, London (GB)

(72) Inventors: Michael Christopher Willmot, Sheffield (GB); Matthew Peter Fitt, Norfolk (GB); Philip Summerfield, Derby (GB); Paul Broughton, Leicester (GB); Richard Peace, Derby (GB); Gary Alan Skinner, Nottingham (GB); Robin Charles Kennea, Nottingham (GB)

(73) Assignee: ROLLS-ROYCE plc, London (GB)

( * ) Notice: Subject to any disclaimer, the term of this patent is extended or adjusted under 35 U.S.C. 154(b) by 793 days.

(21) Appl. No.: 13/716,239

(22) Filed: Dec. 17, 2012

(65) Prior Publication Data

US 2013/0161052 A1    Jun. 27, 2013

(30) Foreign Application Priority Data

Dec. 22, 2011  (GB) .................................. 1122140.5
Dec. 22, 2011  (GB) .................................. 1122143.9
Mar. 7, 2012   (GB) .................................. 1203991.3
Jul. 10, 2012  (GB) .................................. 1212223.0

(51) Int. Cl.
*H05B 3/28* (2006.01)
*H02G 3/00* (2006.01)
(Continued)

(52) U.S. Cl.
CPC ................. *H05B 3/28* (2013.01); *B23P 6/005* (2013.01); *B60R 16/00* (2013.01); *B60R 16/02* (2013.01);
(Continued)

(58) Field of Classification Search
CPC .... H01R 12/515; H01R 12/57; H01R 12/00; H01R 12/51; H01R 12/592; H01R 12/59; H01R 12/61; B60R 16/0207; B60R 16/0215; F02C 7/32

See application file for complete search history.

(56) References Cited

U.S. PATENT DOCUMENTS 2,523,083 A  9/1950  Witkowski
2,523,504 A  9/1950  Ford, Jr.
(Continued)

FOREIGN PATENT DOCUMENTS

DE    2941950 B1   2/1981
EP    1741879 A1   1/2007
(Continued)

OTHER PUBLICATIONS

Apr. 20, 2012 Search Report issued in British Patent Application No. GB1122140.5.
(Continued)

*Primary Examiner* — Phutthiwat Wongwian
*Assistant Examiner* — William Breazeal
(74) *Attorney, Agent, or Firm* — Oliff PLC

(57) ABSTRACT

An electrical raft (200) is provided that has electrical conductors (252) embedded in a rigid material (220). The electrical raft is provided with an electrical connector (700). The electrical connector (700) is mounted in the electrical raft (200) at a mounting angle (730). The mounting angle is set such that the electrical conductors (252) can be connected to the electrical connector without having to turn through an angle or a radius of curvature that would subject them to excessive bending stress. Similarly, the mounting angle means that any conductors (766) that may be connected to the electrical connector (700) do not have to turn through an angle or a radius of curvature that would subject them to excessive bending stress. Furthermore, mounting the electrical connector (700) at the mounting angle (730) may allow the assembled electrical raft (200) to be more compact.

17 Claims, 7 Drawing Sheets

(51) Int. Cl.

| | | |
|---|---|---|
| *B60R 16/00* | (2006.01) | |
| *B64D 29/08* | (2006.01) | |
| *B60R 16/02* | (2006.01) | |
| *H01R 12/59* | (2011.01) | |
| *H01R 12/51* | (2011.01) | |
| *H01R 12/61* | (2011.01) | |
| *F02C 7/16* | (2006.01) | |
| *B64C 3/34* | (2006.01) | |
| *F02C 7/141* | (2006.01) | |
| *B60R 16/08* | (2006.01) | |
| *H05B 1/02* | (2006.01) | |
| *F24H 1/10* | (2006.01) | |
| *F02C 7/224* | (2006.01) | |
| *F02C 7/047* | (2006.01) | |
| *H02G 1/00* | (2006.01) | |
| *F02C 7/20* | (2006.01) | |
| *F02C 7/12* | (2006.01) | |
| *H02G 3/04* | (2006.01) | |
| *B23P 6/00* | (2006.01) | |
| *H01R 12/00* | (2006.01) | |
| *F02C 7/00* | (2006.01) | |
| *F02C 7/32* | (2006.01) | |
| *H02G 3/32* | (2006.01) | |
| *H01R 12/57* | (2011.01) | |
| *H02G 3/02* | (2006.01) | |

(52) U.S. Cl.
CPC ....... *B60R 16/0207* (2013.01); *B60R 16/0215* (2013.01); *B60R 16/08* (2013.01); *B64C 3/34* (2013.01); *B64D 29/08* (2013.01); *F02C 7/00* (2013.01); *F02C 7/047* (2013.01); *F02C 7/12* (2013.01); *F02C 7/141* (2013.01); *F02C 7/16* (2013.01); *F02C 7/20* (2013.01); *F02C 7/224* (2013.01); *F02C 7/32* (2013.01); *F24H 1/105* (2013.01); *H01R 12/00* (2013.01); *H01R 12/51* (2013.01); *H01R 12/515* (2013.01); *H01R 12/57* (2013.01); *H01R 12/59* (2013.01); *H01R 12/592* (2013.01); *H01R 12/61* (2013.01); *H02G 1/00* (2013.01); *H02G 3/00* (2013.01); *H02G 3/02* (2013.01); *H02G 3/04* (2013.01); *H02G 3/32* (2013.01); *H05B 1/0236* (2013.01); *F05D 2260/30* (2013.01); *Y02T 50/672* (2013.01); *Y10T 29/49002* (2015.01); *Y10T 29/49117* (2015.01); *Y10T 29/49234* (2015.01); *Y10T 29/49236* (2015.01); *Y10T 29/49238* (2015.01); *Y10T 156/10* (2015.01)

(56) References Cited

U.S. PATENT DOCUMENTS

| | | |
|---|---|---|
| 2,877,544 A | 3/1959 | Gammel |
| 2,972,230 A * | 2/1961 | Conklin ............... F02C 3/103 60/797 |
| 3,128,214 A | 4/1964 | Lay |
| 3,284,003 A | 11/1966 | Ciemochowski |
| 3,494,657 A | 2/1970 | Harper et al. |
| 3,612,744 A | 10/1971 | Thomas |
| 3,700,825 A | 10/1972 | Taplin et al. |
| 3,710,568 A | 1/1973 | Rice |
| 4,137,888 A | 2/1979 | Allan |
| 4,149,567 A | 4/1979 | Weirich |
| 4,220,912 A | 9/1980 | Williams |
| 4,488,970 A | 12/1984 | Clark |
| 4,671,593 A | 6/1987 | Millon-Fremillon et al. |
| 5,004,639 A | 4/1991 | Desai |
| 5,031,396 A | 7/1991 | Margnelli |
| 5,091,605 A | 2/1992 | Clifford |
| 5,138,784 A | 8/1992 | Niwa |
| 5,142,448 A | 8/1992 | Kober et al. |
| 5,174,110 A | 12/1992 | Duesler et al. |
| 5,249,417 A | 10/1993 | Duesler et al. |
| 5,435,124 A | 7/1995 | Sadil et al. |
| 5,688,145 A | 11/1997 | Liu |
| 5,692,909 A | 12/1997 | Gadzinski |
| 5,795,172 A | 8/1998 | Shahriari et al. |
| 5,870,824 A | 2/1999 | Lilja et al. |
| 5,876,013 A | 3/1999 | Ott |
| 5,885,111 A | 3/1999 | Yu |
| 5,895,889 A * | 4/1999 | Uchida et al. ............... 174/72 A |
| 6,050,853 A | 4/2000 | Ando et al. |
| 6,157,542 A | 12/2000 | Wu |
| 6,399,889 B1 | 6/2002 | Korkowski et al. |
| 6,434,473 B1 | 8/2002 | Hattori |
| 6,481,101 B2 | 11/2002 | Reichinger |
| 6,485,332 B1 | 11/2002 | Kwang |
| 6,588,820 B2 | 7/2003 | Rice |
| 6,689,446 B2 | 2/2004 | Barnes et al. |
| 6,702,607 B2 | 3/2004 | Kondo |
| 6,969,807 B1 | 11/2005 | Lin et al. |
| 6,971,650 B2 | 12/2005 | Marelja |
| 6,971,841 B2 | 12/2005 | Care |
| 7,002,269 B2 | 2/2006 | Angerpointer |
| 7,010,906 B2 | 3/2006 | Cazenave et al. |
| 7,232,315 B2 | 6/2007 | Uchida et al. |
| 7,281,318 B2 | 10/2007 | Marshall et al. |
| 7,389,977 B1 | 6/2008 | Fernandez et al. |
| 7,414,189 B2 | 8/2008 | Griess |
| 7,500,644 B2 | 3/2009 | Naudet et al. |
| 7,506,499 B2 | 3/2009 | Fert et al. |
| 7,516,621 B2 | 4/2009 | Suttie et al. |
| 7,525,816 B2 | 4/2009 | Sawachi |
| 7,543,442 B2 | 6/2009 | Derenes et al. |
| 7,661,272 B2 | 2/2010 | Gagneux et al. |
| 7,745,730 B2 | 6/2010 | Bailey |
| 7,762,502 B2 | 7/2010 | Mesing et al. |
| 7,837,497 B1 | 11/2010 | Matsuo et al. |
| 7,862,348 B2 | 1/2011 | Strauss |
| 8,038,104 B1 | 10/2011 | Larkin |
| 8,137,524 B2 | 3/2012 | Berggren et al. |
| 8,317,524 B2 | 11/2012 | Bailey |
| 8,491,013 B2 | 7/2013 | Peer et al. |
| 8,581,103 B2 | 11/2013 | Aspas Puertolas |
| 8,794,584 B2 | 8/2014 | Shimada et al. |
| 8,937,254 B2 | 1/2015 | Wen et al. |
| 9,010,716 B2 | 4/2015 | Kobori |
| 9,040,821 B2 | 5/2015 | Blanchard et al. |
| 2002/0086586 A1 | 7/2002 | Shi et al. |
| 2002/0170729 A1 | 11/2002 | Murakami et al. |
| 2003/0095389 A1 | 5/2003 | Samant et al. |
| 2003/0155467 A1 | 8/2003 | Petrenko |
| 2004/0065092 A1 | 4/2004 | Wadia et al. |
| 2004/0266266 A1 | 12/2004 | Lai |
| 2004/0266274 A1* | 12/2004 | Naudet et al. ................. 439/719 |
| 2006/0272340 A1 | 12/2006 | Petrenko |
| 2006/0278423 A1* | 12/2006 | Ichikawa ............ B60R 16/0215 174/72 A |
| 2007/0029454 A1 | 2/2007 | Suttie et al. |
| 2007/0084216 A1 | 4/2007 | Mazeaud et al. |
| 2007/0129902 A1 | 6/2007 | Orbell |
| 2008/0128048 A1 | 6/2008 | Johnson et al. |
| 2008/0179448 A1 | 7/2008 | Layland et al. |
| 2008/0185478 A1 | 8/2008 | Dannenberg |
| 2008/0245932 A1 | 10/2008 | Prellwitz et al. |
| 2009/0189051 A1 | 7/2009 | Love |
| 2009/0230650 A1 | 9/2009 | Mayen et al. |
| 2009/0242703 A1 | 10/2009 | Alexander et al. |
| 2009/0277578 A1 | 11/2009 | Sung et al. |
| 2009/0289232 A1 | 11/2009 | Rice |
| 2010/0162726 A1 | 7/2010 | Robertson et al. |
| 2010/0261365 A1 | 10/2010 | Sakakura |
| 2010/0308169 A1 | 12/2010 | Blanchard et al. |
| 2011/0011627 A1 | 1/2011 | Aspas Puertolas |
| 2011/0016882 A1 | 1/2011 | Woelke et al. |
| 2011/0017879 A1 | 1/2011 | Woelke et al. |
| 2011/0053468 A1 | 3/2011 | Vontell |
| 2011/0111616 A1 | 5/2011 | Chang et al. |

(56) References Cited

U.S. PATENT DOCUMENTS

| | | |
|---|---|---|
| 2011/0120748 A1 | 5/2011 | Bailey |
| 2011/0315830 A1 | 12/2011 | Eshima et al. |
| 2012/0012710 A1 | 1/2012 | Yamaguchi et al. |
| 2012/0103685 A1* | 5/2012 | Blanchard et al. ......... 174/72 A |
| 2012/0111614 A1 | 5/2012 | Free |
| 2012/0149232 A1* | 6/2012 | Balzano .................. 439/370 |
| 2012/0312022 A1 | 12/2012 | Lam et al. |
| 2013/0189868 A1 | 7/2013 | Fitt et al. |
| 2013/0316147 A1 | 11/2013 | Douglas et al. |

FOREIGN PATENT DOCUMENTS

| | | |
|---|---|---|
| EP | 1 760 291 A2 | 3/2007 |
| EP | 1 762 714 A2 | 3/2007 |
| EP | 2279852 A1 | 2/2011 |
| EP | 2 590 270 A2 | 5/2013 |
| FR | 2871284 A1 | 12/2005 |
| GB | 1260339 A | 1/1972 |
| GB | 2152147 A | 7/1985 |
| GB | 2477337 A | 8/2011 |
| JP | A-63-285808 | 11/1988 |
| JP | A-4-167376 | 6/1992 |
| JP | A-4-223067 | 8/1992 |
| JP | A-5-129040 | 5/1993 |
| JP | A-2000-299151 | 10/2000 |
| WO | 20091118561 A1 | 10/2009 |
| WO | WO 2010/075390 A2 | 7/2010 |
| WO | WO 2011/061074 A1 | 5/2011 |
| WO | WO 2011/117609 | 9/2011 |
| WO | WO 2011/127996 A1 | 10/2011 |

OTHER PUBLICATIONS

Apr. 19, 2012 Search Report issued in British Patent Application No. GB1122143.9.
Jun. 21, 2012 Search Report issued in British Patent Application No. GB1203991.3.
Jul. 31, 2012 Search Report issued in British Patent Application No. GB1207733.5.
Aug. 7, 2012 Search Report issued in British Patent Application No. GB1207735.0.
Oct. 23, 2012 Search Report issued in British Patent Application No. GB1212221.4.
Nov. 7, 2012 Search Report issued in British Patent Application No. GB1212223.0.
Broughton et al., Pending U.S. Appl. No. 13/716,648, filed Dec. 17, 2012.
Broughton et al., Pending U.S. Appl. No. 13/716,439, filed Dec. 17, 2012.
Broughton et al., Pending U.S. Appl. No. 13/716,254, filed Dec. 17, 2012.
Willmot et al., Pending U.S. Appl. No. 13/716,300, filed Dec. 17, 2012.
Willmot et al., Pending U.S. Appl. No. 13/716,497, filed Dec. 17, 2012.
Broughton et al., Pending U.S. Appl. No. 13/716,587, filed Dec. 17, 2012.
Maszczk et al., Pending U.S. Appl. No. 13/716,796, filed Dec. 17, 2012.
Willmot et al., Pending U.S. Appl. No. 13/716,808, filed Dec. 17, 2012.
Broughton et al., Pending U.S. Appl. No. 13/716,708, filed Dec. 17, 2012.
Dalton et al., Pending U.S. Appl. No. 13/716,244, filed Dec. 17, 2012.
Broughton et al., Pending U.S. Appl. No. 13/716,503, filed Dec. 17, 2012.
Broughton et al., Pending U.S. Appl. No. 13/716,516, filed Dec. 17, 2012.
Nov. 10, 2014 Office Action issued in U.S. Appl. No. 13/716,300.
Nov. 20, 2014 Office Action issued in U.S. Appl. No. 13/716,648.
Fitt et al., Pending U.S. Appl. No. 13/792,851, filed Mar. 11, 2013.
Feb. 25, 2015 Office Action issued in U.S. Appl. No. 13/716,497.
Mar. 11, 2015 Office Action issued in U.S. Appl. No. 13/716,300.
Apr. 23, 2014 European Search Report issued in European Patent Application No. 12 19 7402.
Apr. 24, 2014 European Search Report issued in European Patent Application No. 13 19 5848.
Aug. 5, 2013 Search Report issued in British Patent Application No. 1308033.8.
Oct. 25, 2013 European Search Report issued in European Patent Application No. 13 15 8531.
Broughton et al., U.S. Appl. No. 14/100,745, filed Dec. 9, 2013.
Office Action issued in U.S. Appl. No. 13/716,497 issued Aug. 15, 2014.
Sep. 4, 2015 Office Action issued in U.S. Appl. No. 13/716,503.
Jun. 5, 2015 Office Action issued in U.S. Appl. No. 13/716,708.
Jun. 12, 2015 Office Action issued in U.S. Appl. No. 13/716,254.
Nellis and Klein, "Heat Transfer", 2009, Campridge University, pp. 748-751.
Jun. 19, 2015 Office Action issued in U.S. Appl. No. 13/716,244.
Jul. 29, 2015 Office Action issued in U.S. Appl. No. 13/716,648.
Jul. 17, 2015 Office Action issued in U.S. Appl. No. 13/716,497.
Jul. 28, 2015 Office Action issued in U.S. Appl. No. 13/716,796.
Aug. 13, 2015 Office Action issued in U.S. Appl. No. 13/716,516.
Aug. 27, 2015 Office Action issued in U.S. Appl. No. 13/792,851.
Mar. 10, 2016 Office Action Issued in U.S. Appl. No. 13/792,851.
Apr. 6, 2015 Office Action issued in U.S. Appl. No. 13/716,648.

* cited by examiner

ELECTRICAL CONNECTORS

CROSS-REFERENCE TO RELATED APPLICATIONS

This application is based upon and claims the benefit of priority from British Patent Application Number 1122140.5 filed 22 Dec. 2011, British Patent Application Number 1122143.9 filed 22 Dec. 2011, British Patent Application Number 1203991.3 filed 7 Mar. 2012 and British Patent Application Number 1212223.0 filed 10 Jul. 2012, the entire contents of which are incorporated by reference.

BACKGROUND OF THE INVENTION

1. Field of the Invention

This invention relates to electrical connectors. In particular, aspects of the invention relate to electrical connectors in rigid electrical rafts used to distribute electrical signals around a gas turbine engine.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, are commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding.

Individual wires and cables, for example those indicated at 110, emerge from the sleeving or braiding to terminate at plug or socket connector components 112 for cooperation with complementary socket or plug connector components 114 on, or connected to, the respective electrical components.

Thus the conventional electrical harness has to be provided with plug or socket connector components 112 for connection to other electrical components, such as electrical units such as engine control units. These conventional plug or socket connector components add weight and complexity to the electrical harnesses. Furthermore, the conventional plug or socket connectors are exposed to the engine environment. Thus, the conventional plug or socket connectors may be exposed to, for example, high temperatures and/or vibrations. The exposed connectors therefore need to be particularly robust in order to survive this environment. This means that the conventional exposed connectors are bulky and heavy. Even such bulky and heavy connectors may still be susceptible to damage and/or becoming loose, for example due to engine vibration.

Each conventional harness 102, 104 comprises a multitude of insulated wires and cables. This makes the conventional harness itself bulky, heavy and difficult to manipulate. The conventional harnesses occupy significant space within a gas turbine engine, and thus may compromise the design of the aircraft, for example the size and/or weight and/or shape of the engine and/or components thereof.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

OBJECTS AND SUMMARY OF THE INVENTION

According to an aspect, there is provided an electrical raft comprising a rigid material having electrical conductors embedded therein. The electrical raft comprises an electrical connector having a first set of electrical contacts connected to at least one of the electrical conductors. The electrical connector also has a second set of electrical contacts for electrical connection to another component. The electrical raft has a first major surface separated by a thickness from a second major surface. The electrical connector is mounted in the rigid material so as to form a mounting angle with the first major surface. The mounting angle is in the range of from 20 degrees and 70 degrees. The second set of electrical contacts are accessible from outside the raft (for example from the first major surface) thereby allowing the electrical raft to be electrically connected to said other component.

Any suitable material may be used for the rigid material. For example, the rigid material may be a rigid composite material, for example an organic matrix composite. Such a rigid composite material may be particularly stiff and/or lightweight. Thus, a rigid composite raft may be provided that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the electrical raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

The electrical conductors embedded in the raft may generally extend in a direction that is substantially parallel to the first and/or second major surfaces. The first and second major surfaces may be substantially parallel.

The electrical conductors embedded in the rigid material may be used to transfer electrical signals around a gas turbine engine. Embedding electrical conductors in a rigid material (to create an electrical raft) has a great number of advantages over transferring electrical signals using a conventional harness, at least some of which are discussed herein.

The electrical connector(s) may be integrated with, or integral to, the electrical raft, and thus may be protected by the rigid material of the raft and thus may be more reliable and less susceptible to damage, for example than connectors in a conventional harness. Furthermore, because they may be assembled with the electrical raft, their position can be determined accurately, and not susceptible to error during connection to other units.

The electrical raft (and/or electrical raft assembly described below) may be a part of any electrical system. For example, an electrical raft/electrical raft assembly may form part of a gas turbine engine. In this case, the electrical raft/electrical raft assembly may form part of an electrical harness, for example for a gas turbine engine, and thus may be referred to as an electrical harness raft. Electrical rafts may provide greater protection to the electrical conductors than a conventional harness. For example, the rigid and/or hard material (which may be a rigid and/or hard composite material) in which the conductors are embedded may provide greater protection (for example greater mechanical protection) to the embedded conductors, for example due to being resistant to breaking and/or snapping and/or piercing and/or puncturing. Purely by way of example, the use of electrical rafts may reduce, or substantially eliminate, the chance of foreign bodies coming into contact with the electrical conductors, for example through fluid ingress. The electrical raft(s) may provide improved protection to the electrical conductors during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

The mounting angle may be said to be formed between the electrical connector and a local tangent plane to the first major surface. The electrical connector may, for example, have a longitudinal axis (for example it may have an elongate housing having a longitudinal axis), and the mounting angle may be said to be between the longitudinal axis of the electrical connector and the first major surface.

Further advantages are provided by having a mounting angle in the range of from 20 degrees to 70 degrees. For example, such a mounting angle may allow the second set of electrical contacts to be readily accessible from the electrical raft (for example from the first major surface of the electrical raft), whilst ensuring that electrical conductors leading into the connector (for example the conductors embedded in the raft) and/or out of the connector (for example electrical conductors that may form part of a component connected to the connector) do not have to bend through a large angle and/or a tight corner (small bend radius). This may reduce the stress on the conductors and/or the connectors, for example mechanical stress that may otherwise be induced due to tight bending of the conductors. In turn, this may improve the reliability and/or service life of the conductors, and thus the electrical raft.

The mounting angle may be in the range of from 25 degrees to 65 degrees, for example in the range of from 30 degrees to 60 degrees, for example in the range of from 35 degrees to 55 degrees, for example in the range of from 40 degrees to 50 degrees, for example on the order of 45 degrees. This may further help to improve the reliability and/or service life of the conductors, and thus the electrical raft.

A mounting angle in the ranges set out herein may also provide the advantage of reducing the overall thickness of the electrical raft including the embedded connector. For example, such a mounting angle may enable the electrical connector to protrude less, or not at all, from the surface of the electrical raft, if desired.

The second set of electrical contacts may be aligned with the mounting angle of the electrical connector. This may allow reliable connection with complimentary electrical contacts on a further electrical component that may be attached to the electrical raft via the connector.

Similarly, the first set of electrical contacts may be aligned with the mounting angle of the electrical connector. This may help to ensure that the electrical conductors embedded in the raft that are connected through the first set of electrical contacts do not have to turn through a tight bend radius, and thus may help to ensure reliability. In this regard, if, for example, the electrical conductors were forced to turn through a large angle (for example greater than that required by the mounting angle), this would also have to be achieved within the thickness of the electrical raft, thus requiring a smaller bend radius than that required for the conductors to turn through the mounting angles described herein The first set of electrical contacts may be embedded in the electrical raft, and thus not exposed to the environment surrounding the electrical raft. This may help to further improve reliability, for example by reducing the possibility of ingress of dirt/fluid to the first set of electrical contacts. In other words, the first set of electrical contacts may be contained within the electrical raft, and this may help to protect them from damage and/or degradation.

At least some of the electrical conductors embedded in the electrical raft may be electrical wires. The electrical wires may be provided with a protective and/or insulating sheath/braiding. As such, individual wires may be laid into (or embedded in) the electrical raft, and each wire may be used to transfer one or more electrical signals through the raft and around an engine. The electrical conductors (which may be electrical wires) may be permanently fixed to (and thus permanently in electrical connection with) the first set of electrical contacts. This may mean that the embedded electrical conductors feed directly into the first set of electrical contacts. In that case, the first set of electrical contacts may be defined as being the portion(s) of the electrical connector into which the electrical wires feed.

Electrical conductors that are permanently fixed to the first set of electrical contacts may turn through an angle equal to the mounting angle in order to be fixed to the first set of electrical contacts. Thus, the embedded electrical conductors may not experience excessive mechanical stress as they turn to connect with the first set of electrical contacts.

In all examples, the embedded electrical conductors may be substantially aligned with the first/second major surfaces except in the region of first set of electrical contacts.

At least some of the electrical conductors may be provided in a flexible printed circuit. The electrical conductors may thus be in the form of electrical tracks formed in a flexible substrate. The flexible printed circuit may be flexible before being embedded in the rigid material.

Providing the electrical conductors as tracks in a flexible printed circuit may allow the size and/or weight of the resulting electrical raft to be reduced further and/or substantially minimized. For example, multiple electrical conductors may be laid into a flexible printed circuit in close proximity, thereby providing a compact structure. The flexible substrate of a single flexible printed circuit may provide electrical and/or mechanical protection/isolation to a large number of electrical conductors.

The flexible printed circuit (FPC) may be provided with a connector to connect the electrical tracks to the electrical connector. The electrical tracks may terminate in conductive openings in such a connector. Such a connector may be referred to as a lollipop connector, and may be generally planar. The first set of electrical contacts may comprise pins that are received in respective openings so as to electrically connect the electrical tracks to the electrical connector. This may be a particularly compact and/or lightweight and/or robust arrangement for connecting electrical tracks in an embedded flexible printed circuit to the electrical connector.

The electrical conductors provided in the flexible printed circuit may turn through an angle equal to 90 degrees minus the mounting angle before being connected to the first set of electrical contacts. For example, the electrical conductors provided in the flexible printed circuit may turn through an angle equal to 90 degrees minus the mounting angle before terminating in the openings in the flexible printed circuit connector. Thus, the flexible printed circuit and the electrical conductors laid therein may not experience excessive mechanical stress as they turn to connect with the first set of electrical contacts.

Any given electrical raft may be provided with one or more electrical wires embedded therein (which may be sheathed) and/or one or more flexible printed circuits embedded therein. As such, a given electrical raft may have wires and flexible printed circuits laid therein.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical raft. It will also be appreciated that the embedded electrical conductors may be said to be surrounded by the rigid material and/or buried in the rigid material and/or integral with (or integrated into) the rigid material.

The electrical connector may comprise a housing having a first end and a second end. The first set of electrical contacts may be at the first end and the second set of electrical contacts may be at the second end. This may be a convenient arrangement for providing the second set of electrical contacts in a position that allows them to be connectable to another component, and the first set of electrical contacts at a position that allows them to be connected to one or more of the embedded electrical conductors.

The housing may allow the connector to be easily handled and positioned, for example during assembly/manufacture, and/or may provide protection to the internal parts of the connector (which may, for example, include components for electrically connecting the first set of electrical contacts with the second set of electrical contacts).

The electrical raft may comprise a protective shield located between at least a part of the electrical connector (which may include, for example, the housing) and at least some of the rigid material of the electrical raft. Such a protective shield may protect the first set of electrical contacts and/or the electrical conductors connected to the first set of electrical contacts and/or at least a part the housing (where present). The protective shield may provide protection from, for example, ingress of fluids, such as water, oil fuel or other liquids and/or protection against resin movement during manufacture.

The electrical raft may further comprise a location feature in contact with the electrical connector. The location feature may locate the electrical connector at the correct orientation relative to the first major surface. The location feature may be a part of the electrical connector itself. The location a feature may be in contact with the rigid raft material (for example embedded in the rigid raft material). In other words, the location feature may ensure that the electrical connector is at the desired mounting angle in the electrical raft assembly.

The location feature may be a substantially flat (or thin) element with major surfaces that are aligned with the first and second major surfaces of the electrical raft when the electrical connector is at the desired mounting angle. For example, the location feature may be an elongate element with a longitudinal axis that is aligned with the first and second major surfaces of the electrical raft. The location feature may thus be readily formed (for example laid) in the rigid raft, thereby facilitating correct orientation of the electrical connector.

The electrical raft may comprise an earthing (or grounding) mesh. Such an earthing mesh may (or may not) be provided to any electrical raft. The earthing mesh may be referred to as an electrical screen layer, and may or may not take the form of a mesh. The earthing mesh may provide electrical screening to the electrical conductors embedded in the raft. For example, the earthing mesh may provide electrical screening against electrical interference and/or from electrical surges, for example from lightening strikes. The earthing mesh may be grounded, for example to a gas turbine engine to which the electrical raft may be provided. The earthing mesh may take any suitable form/arrangement. For example, it may be a mesh-type construction (meaning that it may be a surface with holes provided therein) and/or may be metallic. The earthing mesh may be embedded in the composite structure (for example it may be provided during manufacture). Alternatively or additionally, a fixture may be provided to hold the earthing mesh in position. The earthing mesh may be connected (electrically and/or mechanically) to the location feature, where both are present.

According to an aspect, there is provided an electrical raft assembly comprising an electrical raft as described above and elsewhere herein, together with a further electrical component comprising a complimentary set of electrical contacts that correspond to the second set of electrical contacts of the electrical raft. The electrical raft and the further electrical component may be in electrical connection through the second set of electrical contacts and the complimentary set of electrical contacts.

The complimentary set of electrical contacts may be in the form of a plug. In any example of the invention, the second set of electrical contacts of the electrical raft may be in the form of a plug. The further electrical component may be any sort of electrical component, for example a set of electrical conductors that link the electrical raft to a still further electrical component. Such a set of electrical conductors may be, for example, in the form of one or more wires, which may be bundled together and/or which may be sheathed/braided, and/or in the form of an FPC. In such an example, providing the electrical connector at a mounting angle means that the set of electrical conductors that form a part of the further electrical component may be manipulated so as to extend in a direction that is substantially parallel with the first and second major surfaces of the electrical raft without having to turn through a tight bend radius and/or large angle. This may help to reduce the stress that those conductors are subjected to, and thus may help to reduce failure rate and/or allow less robust (and thus potentially heavy/expensive) conductors/protection to be used. Additionally or alternatively, the further electrical component may be, for example, an electrical unit. Such an electrical unit may be mechanically fixed/mounted to the surface of the electrical raft, for example to the first major surface. The mechanical fixing may be independent of the electrical connection.

According to an aspect, there is provided a gas turbine engine comprising an electrical raft and/or an electrical raft assembly as described and/or claimed herein.

Use of one or more electrical rafts may significantly reduce build time of an engine. For example, use of electrical rafts may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical rafts/electrical raft assemblies, which themselves may be straightforward to handle, position, secure and connect. As described herein, electrical rafts may be conveniently and easily connected to each other and/or to other electrical components using flexible cable(s) (which may be FPCs). Thus, use of electrical rafts in a gas turbine installation may reduce assembly time and/or reduce the possibility of errors occurring during assembly.

Use of electrical rafts may provide significant advantages during maintenance, such as repair and overhaul. As discussed above, the electrical rafts may be particularly quick and straightforward to assemble. The same advantages discussed above in relation to assembly apply to disassembly/ removal from the gas turbine engine. Thus, any repair/ overhaul that requires removal of at least a part of the electrical harness may be simplified and/or speeded up through use of electrical rafts as at least a part of the electrical harness, for example compared with conventional harnesses. Use of electrical rafts may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts prior to engine assembly, for example pre-testing of the connector and its first and second sets of contacts. This may allow the electrical and/or mechanical operation of the electrical rafts to be proven before installation, thereby reducing/eliminating the testing required during engine installation.

Accordingly, there is provided (and aspects of the invention may be used with/as a part of) a method of servicing a gas turbine engine, the method comprising: removing a first rigid raft assembly (for example comprising an electrical raft as described herein) from the gas turbine engine, the rigid raft assembly incorporating at least a part of at least one component or system of the gas turbine engine; and installing a second, pre-prepared, rigid raft assembly (for example comprising an electrical raft as described herein) onto the gas turbine engine in place of the first raft assembly. The first and second rigid raft assemblies may be electrical harness raft assemblies having electrical conductors embedded in a rigid material. The electrical conductors may be at least a part of an electrical system arranged to transfer electrical signals around the engine.

The electrical rafts may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires and/or insulating sleeves would be required. The reduced weight may be particularly advantageous, for example, when used on gas turbine engines on aircraft.

Electrical rafts may be more easily packaged and/or more compact, for example than conventional harnesses. Providing an electrical connector at a mounting angle as described herein may allow a still further reduction in the combined size of an electrical raft connected with other components. The electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft is attached, such as a fan casing or a core casing.

The electrical signals transferred by the conductors in the electrical raft, and around an engine, for example, using the electrical rafts/raft assemblies may take any form. For example, the electrical signals may include, by way of non-limitative example, electrical power and/or electrical control/communication signals and/or any other type of transmission through an electrical conductor. Transmission of signals around a gas turbine engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/ communicate any possible combination of electrical signals in any part of a gas turbine engine installation or a related (for example electrically and/or mechanically connected) structure/component/system.

The electrical raft or electrical raft assembly may be a first engine installation component of a gas turbine engine. The gas turbine engine may comprise a second engine installation component having electrical conductors. The first and second engine installation components may be a part of an electrical system arranged to transfer electrical systems around the engine. The gas turbine engine, or the electrical system, may comprise at least one flexible cable (which may be, for example, an FPC and/or at least one electrically conductive wire) connected between the electrical raft or electrical raft assembly and the second engine installation component so as to electrically connect electrical conductors of the electrical raft or electrical raft assembly with electrical conductors of the second engine installation component.

The second engine installation component could be any suitable component, such as another electrical raft/electrical raft assembly, or an ECU, such as en electronic engine controller (EEC), or Engine Health Monitoring Unit (EMU).

The environment of a gas turbine engine during operation may be particularly severe, with, for example, high levels of vibration and/or differential expansion between components as the temperature changes through operation and as the components move relative to each other. Providing at least one flexible cable to connect an electrical raft to another component may allow the electrical rafts and/or components to accommodate vibration and/or relative movement, for example of the component(s)/assemblies to which they are attached/mounted during use. For example, the flexible cable(s) used to electrically connect electrical raft(s) to other component(s) may have sufficient length to accommodate such vibration and/or movement during use.

According to an aspect, there is provided a method of manufacturing (including assembling, repairing, reassembling and/or overhauling) a gas turbine engine. The method comprises attaching an electrical raft (or electrical raft assembly) to the engine. The method also comprises electrically connecting a further electrical component of the gas turbine engine to the electrical raft by connecting the second set of contacts to a complimentary set of contacts of the further electrical component. The further electrical component may be as described elsewhere herein, for example a flexible cable (such as a FPC), or an ECU, such as en electronic engine controller (EEC), or Engine Health Monitoring Unit (EMU).

An electrical raft or electrical raft assembly may be provided in any suitable location/position of a gas turbine engine. For example, the gas turbine engine may comprise a bypass flow duct formed between an engine core and an engine fan casing (the gas turbine engine may be a turbofan engine, for example); and the electrical raft may form at least a part of a radially extending splitter (which may be referred to as a bifurcation) that extends across the bypass flow duct. In this way, such an electrical raft (which may be referred to as a splitter electrical raft) may provide an electrical connection between a fan casing and an engine core. By way of further example, electrical rafts or electrical raft assemblies may be mounted to, for example, the engine is core (including the engine core casing) and/or the fan case/nacelle.

An electrical raft may be provided with (for example have embedded therein) at least one additional electrical socket, which may or may not be mounted at the mounting angle described herein. The or each additional electrical socket may be in electrical contact with at least one of the respective electrical conductors embedded in the rigid material and may have terminals for connection with a complimentary connector. Such an additional electrical socket may take any suitable form, and may allow the electrical raft to be easily connected to other components, such as flexible cables and/or other electrical rafts.

An electrical raft may have components and/or parts of other systems embedded therein, such as fluid passages (or pipes) that may form a part of a fluid system, for example for carrying a gas (such as cooling air, sealing air, and/or muscle air (for example for pneumatic systems)) and/or a liquid (such as fuel, water, oil and/or hydraulic fluid). Accordingly, there is provided (and aspects of the invention may be used with/as a part of) a rigid raft assembly for a gas turbine engine, the rigid raft assembly comprising a rigid material that carries at least a part of a first gas turbine engine system and at least a part of a second gas turbine engine system, wherein: the first gas turbine engine system is a fluid system that comprises at least one fluid passage that is at least partially embedded in the rigid raft assembly. The second gas turbine engine system may be an electrical system that comprises electrical conductors at least partially embedded in the rigid material. Thus the rigid raft assembly may be an electrical rigid raft assembly.

An electrical raft assembly may comprise (for example have mounted thereon) other components/systems of the gas turbine engine, for example ancillary, auxiliary or control components. Such other components/systems may be provided to an electrical raft in any suitable manner. For example, such other components/systems may be mounted on one or more electrical rafts. Thus, a surface of an electrical raft may be used as a mounting surface for other gas turbine engine components/systems, such as ancillary/auxiliary components/systems.

An electrical raft may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical raft may provide a stable, regular and convenient platform on which to mount the various systems/components. The combination of the installed electrical raft with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft (and thus to the engine) as required. For example, fluid pipes for transferring fluid around the engine may be mounted to the electrical rafts (for example mechanically mounted using a bracket), and thus to the engine. The fluid pipes may be arranged to carry any fluid as desired, including gas (such as cooling air, sealing air, and/or muscle air (for example for pneumatic systems)) and/or liquid (such as fuel, water, oil and/or hydraulic fluid). Of course, more than one set of fluid pipes, for example for carrying different or the same fluids, may be mounted on the same electrical raft.

Examples of other components/systems that may be at least in part mounted to an electrical raft include, by way of non-limitative example: fire detectors and/or fire detection elements; thermocouples for measuring air temperature (for example within a particular engine zone); vibration monitoring processing equipment (for example a signal processing component/box containing electronics used to process a vibration signal that may be measured elsewhere in the engine); equipment for measuring fluid quality (for example a probe for oil debris monitoring may be provided to one or more pipes mounted to the raft, and/or a signal processing box for processing the oil quality measurements may be mounted on the box); and pressure sensors and/or signal processing equipment, for example for fluid pipes mounted on the rafts. At least some of these components/systems may form be electrically connected to the electrical conductors in the electrical raft using the electrical connector(s) of the electrical rafts. At least one other component/system may be at least partially embedded in an electrical raft. For example, at least one fluid passage may be at least partially embedded in an electrical raft. Such a fluid passage may take the form of a fluid pipe embedded in the electrical raft, or a conduit formed in the electrical raft during manufacture.

At least one electrical raft or raft assembly may be connected/attached/mounted to the gas turbine engine using at least one anti-vibration mount. Using an anti-vibration mount to attach the electrical raft/assembly to the gas turbine engine may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (as discussed above and elsewhere herein) may also benefit from being mounted to the gas turbine engine via the anti-vibration mounts, through being mounted on the electrical raft. For an electrical raft assembly, the reduced vibration may help to preserve the electrical contact between the electrical raft and the electrical unit connected thereto. As such, any components (such as the electrical unit mounted to the electrical raft in an electrical raft assembly) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft (for example to a mounting surface of the electrical raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

BRIEF DESCRIPTION OF THE DRAWINGS

The invention will now be described, by way of example only, with reference to the accompanying Figures, in which.

DETAILED DESCRIPTION OF THE PREFERRED EMBODIMENTS

Figure 1:
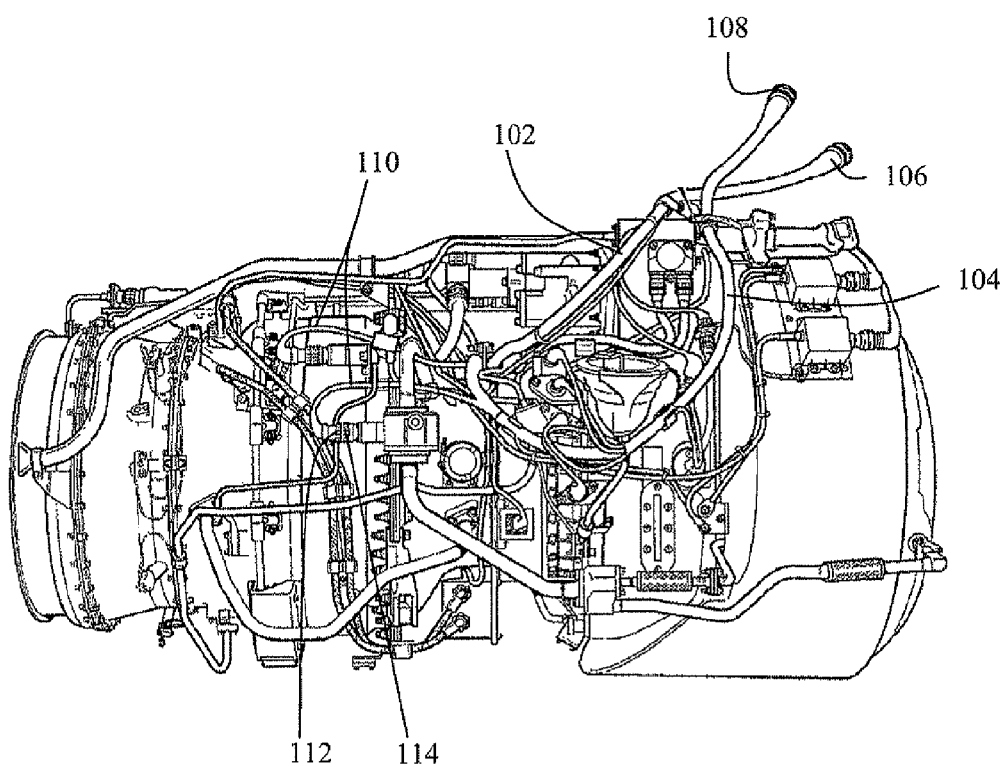
FIG. 1 shows a gas turbine engine with a conventional harness.
Figure 2:
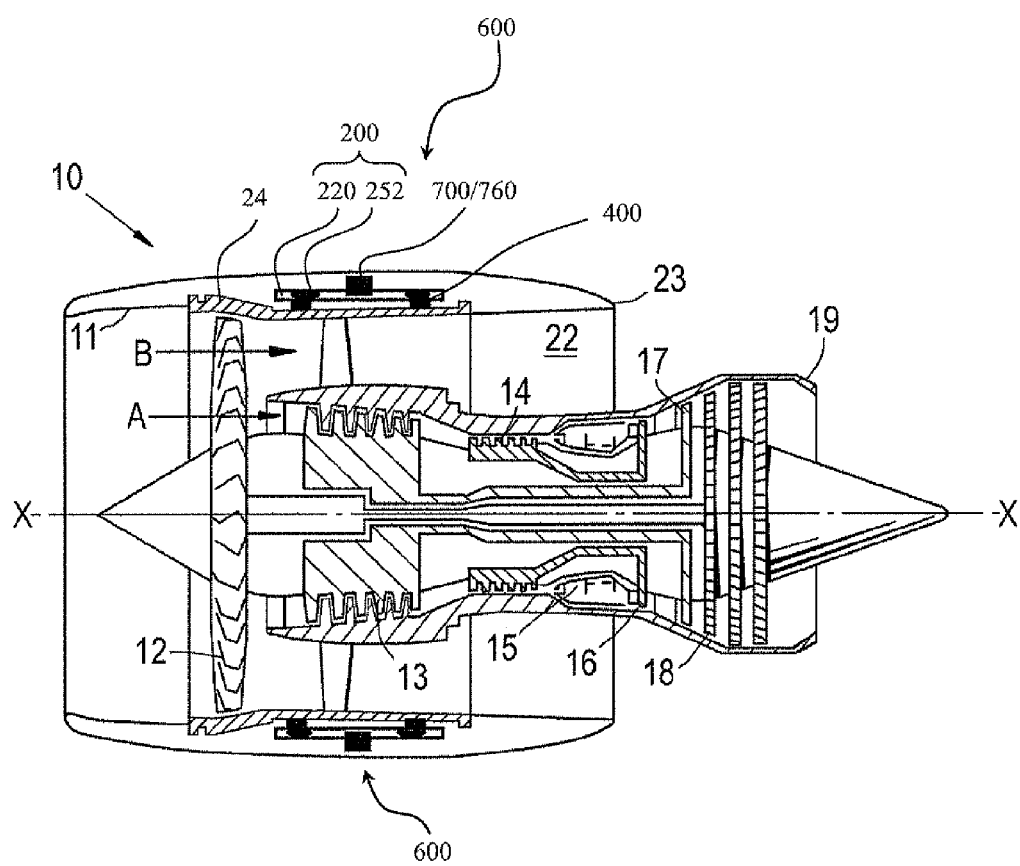
FIG. 2 shows a cross-section through a gas turbine engine having an electrical raft in accordance with the present invention.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted.

The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 comprises at least one electrical raft 200 according to the present invention. As such, the gas turbine engine 10 is in accordance with the present invention. The electrical raft 200 comprises an electrical connector 700. The electrical raft 200 may be used to transmit/transfer electrical signals (or electricity, including electrical power and/or electrical control signals) around the engine and/or to/from the engine 10 from other components, such as components of an airframe. The function and/or construction of the electrical raft 200 including the electrical connector 700 may be as described above and elsewhere herein.

In FIG. 2, each electrical raft 200 (which may be referred to herein simply as a raft 200 or an electrical harness raft 200) comprises at least one electrical conductor 252 embedded in a rigid material 220, which may be a rigid composite material. In some embodiments, the electrical raft 200 may be provided with other gas turbine components/systems, such as fluid pipes or conduits forming at least a part of a fluid system. Such fluid pipes may be attached to the electrical raft 200 using mounting brackets. Additionally or alternatively, such fluid pipes may be embedded in the electrical raft 200.

In FIG. 2, the electrical rafts 200 form part of respective electrical raft assemblies 600. Each electrical raft assembly 600 also comprises a further electrical component 760. The further electrical component 760 is electrically connected to a respective electrical raft 200 via the electrical connector 700 that is part of the electrical raft 200. The electrical raft 200 and the further electrical component are described in greater detail elsewhere herein.

The electrical raft(s) 200 may be attached to the rest of the gas turbine engine 10 using mounts 400, which may be anti-vibration (AV) mounts configured to reduce or substantially eliminate vibration from components of the gas turbine engine 10 being passed to the electrical raft 200, and thus to any components/systems mounted thereon/connected thereto.

Figure 3:
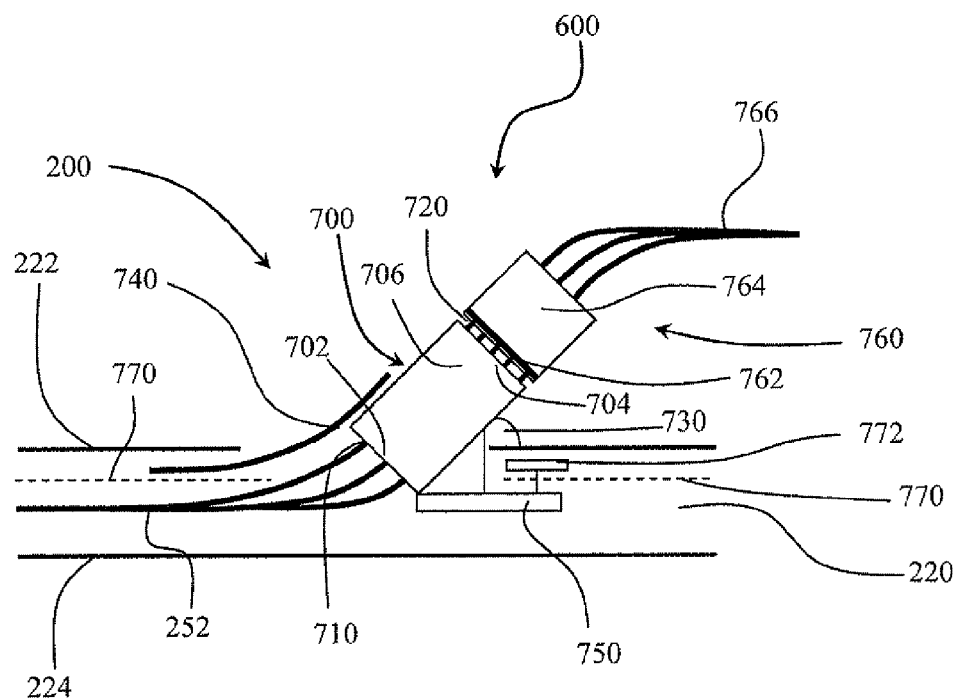
FIG. 3 shows part of an electrical raft having an electrical connector according to an aspect of the present invention.

FIG. 3 is a more detailed view of an electrical raft assembly 600. The electrical raft assembly 600 comprises an electrical raft 200. The raft electrical assembly 600 also comprises a further electrical component 760. The electrical raft 200 comprises an electrical connector 700. The further electrical component 760 is connected to the electrical raft 200 via the electrical connector 700, as described in more detail below.

Figure 4:
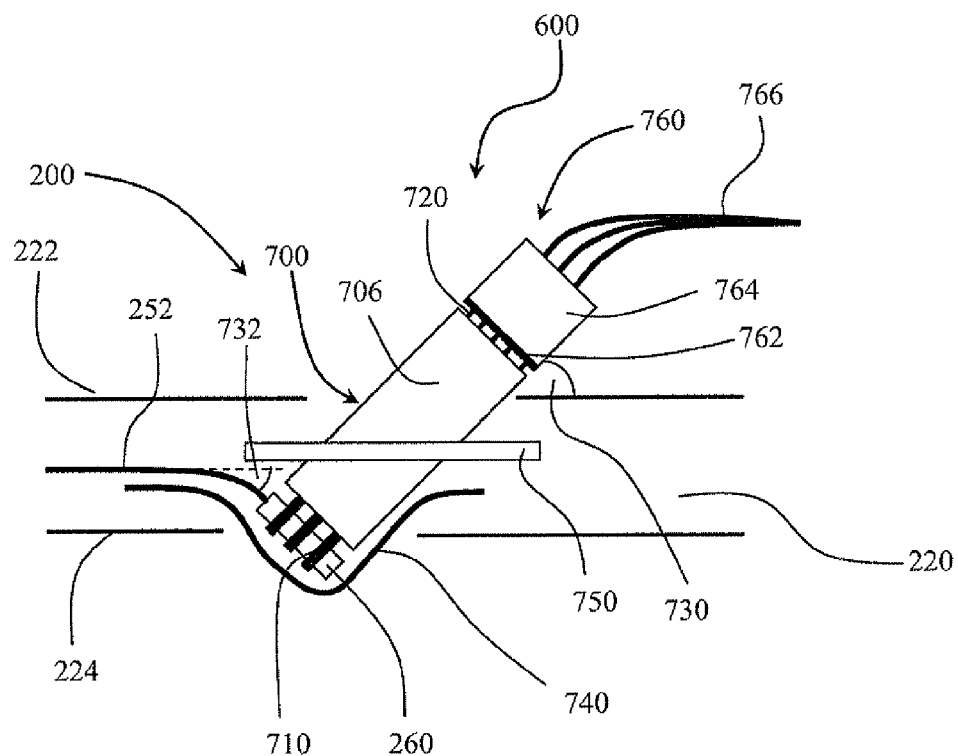
FIG. 4 shows part of an electrical raft having an electrical connector according to an aspect of the present invention.

The electrical connector 700 comprises a first set of electrical contacts 710 through which the embedded electrical conductors 252 are electrically connected to the electrical connector. The first set of electrical contacts 710 may take any suitable form. For example, the first set of electrical contacts 710 may take the form of male of female contacts. The first set of electrical contacts 710 may be, for example, openings into which respective electrical conductors 252 enter. The electrical conductors 252 may be said to plug into the first set of electrical contacts 710 directly or indirectly. For example, there may be an intermediate conductor plug or connector in which the electrical conductors terminate, which is then electrically connected to the first set of electrical contacts 710. An example of such an intermediate conductor plug or connector 260 is shown in FIG. 4 and described in greater detail below.

The electrical connector 700 of FIG. 3 also comprises a second set of electrical contacts 720. Again, the second set of electrical contacts 720 may take any suitable form, such as male or female connectors, which may be in the form of a plug or socket. The second set of electrical contacts 720 electrically connect the electrical connector 700, and thus the conductors 252 in the electrical raft 200, to the further electrical component 760. In the example shown in FIG. 3, the further electrical component 760 comprises a complimentary set of contacts 762. The complimentary set of contacts 762 in FIG. 3 are complimentary to the second set of electrical contacts 720. The complimentary set of electrical contacts 762 and the second set of electrical contacts 720 may be removably connected together. Thus the electrical connector 700 and the further electrical component 760 may be separable, or removably connected together via the second set of electrical contacts 720 and the complimentary set of electrical contacts 762. The complimentary set of electrical contacts 762 and the second set of electrical contacts 720 may additionally provide mechanical connection between the electrical connector 700 and the further electrical component 760. Alternatively, separate mechanical connectors (not shown) may be provided to hold, or lock, the electrical connector 700 and the further electrical component 760 together.

The FIG. 3 arrangement also comprises an earthing mesh 770. Such an earthing mesh 770 may (or may not) be provided to any electrical raft 200. For example, the FIG. 4 arrangement may also be provided with an earthing mesh 770, although no such earthing mesh 770 is shown in FIG. 4. The earthing mesh 770 may provide electrical screening to the electrical conductors embedded in the raft. The earthing mesh may be embedded in the composite structure (for example it may be provided during manufacture). In FIG. 3, an earthing mesh fixture 772 is provided to hold the earthing mesh 770 in position. However, the earthing mesh fixture 772 need not necessarily be required. For example, the earthing mesh 770 may be embedded and secured in position during manufacture.

The further electrical component 760 may take any suitable form. In FIGS. 3 and 4, for example, the further electrical component 760 comprises a set of electrical conductors 766, which may take any form, such as a FPC, and/or one or more wires, which may be sheathed and/or bundled together. Thus, the set of electrical conductors 766 may be flexible. The set of electrical conductors 766 may be used, for example, to connect the electrical raft 200 to another electrical component, which may be, for example, another electrical raft 200 or an ECU, such as an EEC or EMU. In FIG. 3, the further electrical component 760 also comprises a body 764. The body 764 may be a plug or socket. The complimentary set of electrical contacts 762 may be formed on one end of the body 764. The electrical conductors 766 may extend from the other end of the body 764.

Alternatively, as mentioned elsewhere herein, the further electrical component 760 may be any type of electrical component. For example, the further electrical component may be an electrical unit, or ECU, such as an EEC or an EMU. Thus, the further electrical component 760 may be an electrical unit, which may be connected to the electrical raft 200, for example directly connected to the second set of electrical contacts 720 using a set of complimentary electrical contacts.

The electrical connector 700 is mounted in the rigid material 220 at a mounting angle 730. The mounting angle 730 is the acute angle formed between the electrical connector 700 and the electrical raft 200. As shown in FIG. 3, the mounting angle 730 may be the (acute) angle formed between the electrical connector 700 (or the direction in which the electrical connector 700 protrudes/extends) and the surface 222 (which may be referred to as a first major surface 222 of the electrical raft 200) from which the electrical connector 700 protrudes/extends.

The mounting angle 730 shown in FIGS. 3 and 4 is for illustrative purposes only. In general, the mounting angle 730 is in the range of from 20 degrees to 70 degrees, for example in the range of from 25 degrees to 65 degrees, for example in the range of from 30 degrees to 60 degrees, for example in the range of from 35 degrees to 55 degrees, for example in the range of from 40 degrees to 50 degrees, for example on the order of 45 degrees.

In order to achieve and/or facilitate achieving the desired mounting angle, the electrical raft 200 may comprise a location feature 750. In the FIG. 3 and FIG. 4 examples, the location feature 750 is a part of the electrical connector 700. However, in alternative embodiments, the location feature may be separate from the electrical connector 700. For example it may be a separate feature that may be embedded into the raft 200, which may then be used to locate the electrical connector 700 in position. The location feature 750 may be a thin element, which may be elongate, as in the examples shown in FIGS. 3 and 4. The location feature 750 may be aligned with the electrical raft 200, for example with the first and/or second major surfaces 222, 224 of the rigid material 220. In other words, during assembly, the location feature 750 may be aligned with the first and/or second major surfaces 222, 224 in order to ensure that the mounting angle 730 is as desired. However, it will be appreciated that a location feature could take any suitable form in order to facilitate correct mounting/location of the electrical connector 700 in the rigid material 220.

The electrical connector 700 may have a housing 706. The housing 706 may contain internal components of the electrical connector 706, such as internal electrical connections (not shown). The housing 706 may have a first end 702 and a second end 704, which may be opposite to each other. The first set of electrical contacts 710 may be formed at the first end 702. The second set of electrical contacts 720 may be formed at the second end 704. The first end 702 may be at least partially embedded in the rigid material 220, as shown in the examples of FIGS. 3 and 4.

The electrical raft 200 may also comprise a protective shield, examples of which are labelled 740 in the examples of FIGS. 3 and 4. Such a protective shield 740 may help to provide protection to parts of the electrical raft 200. For example, the protective shield 740 may provide sealing against ingress of fluids (such as water, oil and fuel) during use and/or protection against resin movement during manufacture. The protective shield 740 may be located between parts of the electrical raft 200 and the environment surrounding the electrical raft 200 and/or between parts of the electrical raft 200 and the rigid material 220. The protective shield 740 may provide a shield for at least a part of the first set of electrical contacts 710, as shown in the FIGS. 3 and 4 examples. Additionally or alternatively, the protective shield 740 may provide a shield for any other parts of the electrical raft 200, for example for at least a part of at least some of the electrical conductors 252 and/or at least a part of a housing 706 of the electrical connector, for example the first end 702 of the housing 706.

Figure 5:
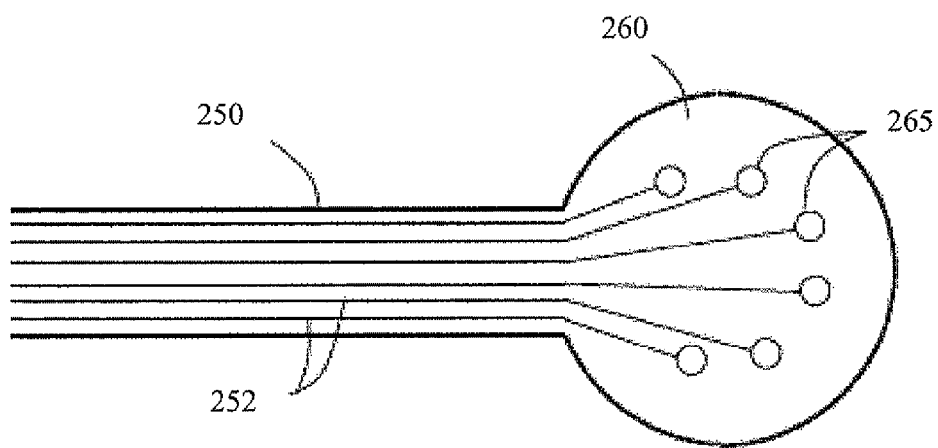
FIG. 5 shows a flexible printed circuit connector for use in the present invention.

The examples of FIGS. 3 and 4 have many features in common, and like features are labelled with the same reference numeral. A difference between the FIG. 3 and FIG. 4 examples is in the connection of the embedded conductors 252 to the first set of electrical contacts 710. In FIG. 4, the electrical conductors terminate in a dedicated connector 260, which is then connected to the first set of electrical contacts 710. As shown in greater detail in FIG. 5, the dedicated connector 260, which may be referred to as a lollipop connector 260 or a flexible printed circuit connector 260, comprises openings 265. An opening 265 is formed at the end of a respective electrical conductor (or track) 252, which may be in the form of a FPC, as in FIG. 5. The openings 265 are configured to receive the first set of electrical contacts 710, for example the first set of electrical contacts may comprise pins (as shown in FIG. 4), each of which is received in a respective opening 265. The dedicated connector 260 may be substantially rigid such that it maintains its shape under operating and/or manufacture loads. This may be achieved, for example, by reinforcing the dedicated connector with a rigid material.

In order for the embedded electrical conductors 252 to be connected to the electrical connector 700 in the manner shown in FIG. 4, the electrical conductors must turn through an angle equal to 90 degrees minus the mounting angle 730. This may be referred to as a complimentary mounting angle 732. This complimentary mounting angle may be such that the conductors 252 can be bent into position without causing undue stress, and thus with a minimal risk of damage. In general, the complimentary mounting angle 732 is in the range of from 20 degrees to 70 degrees, for example in the range of from 25 degrees to 65 degrees, for example in the range of from 30 degrees to 60 degrees, for example in the range of from 35 degrees to 55 degrees, for example in the range of from 40 degrees to 50 degrees, for example on the order of 45 degrees.

FIGS. 3 and 4 show a part of an electrical raft 200, including just one electrical connector 700. However, it will be appreciated that an electrical raft 200 or electrical raft assembly 600 may comprise any number of electrical connectors 700, any one or more of which may be mounted/embedded at the mounting angle 730 described herein. Some electrical rafts 200 or electrical raft assemblies 600 may have at least one electrical connector 700 mounted at a mounting angle as described herein, together with one or more electrical connectors mounted at different angles depending on, for example geometric and spatial constraints.

Figure 6:
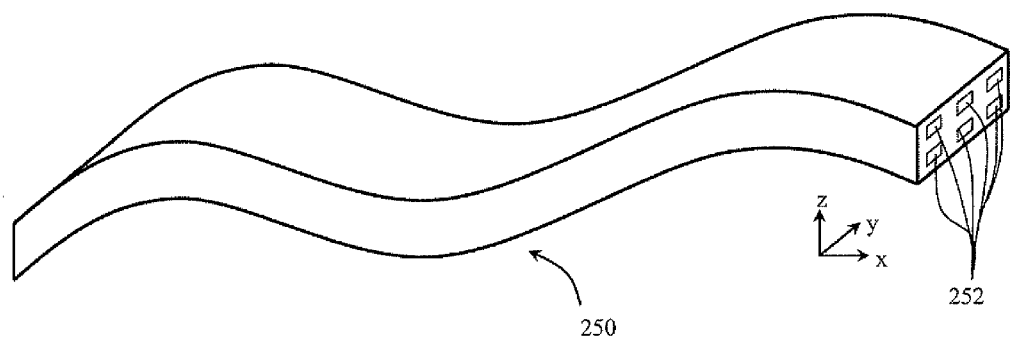
FIG. 6 shows a perspective view of a flexible printed circuit.
Figure 7:
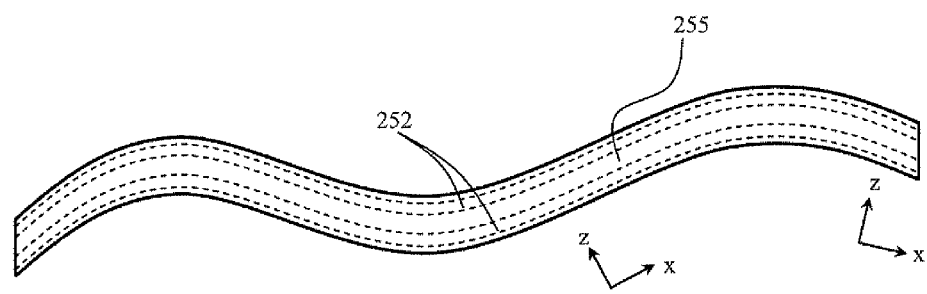
FIG. 7 shows a side view of the flexible printed circuit shown in FIG. 6.

As mentioned elsewhere herein, the embedded electrical conductors 252 may be provided in the form of conductive tracks in a flexible printed circuit (FPC). Additionally or alternatively, the further electrical component 760 may comprise electrical conductors 766, some or all of which may also be in the form of an FPC. An example of an FPC 250 in which the electrical conductors 252 may be provided is shown in greater detail in is FIGS. 6 and 7. FIG. 6 shows a perspective view of the FPC 250, and FIG. 7 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 6 and 7, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 7. The x-y surface(s) (ie the surfaces formed by the x and y directions) may be said to be the major surface(s) of the FPC 250. In the example shown in FIGS. 6 and 7, the FPC 250 is deformable at least in the z direction, i.e. in a direction perpendicular to the major surface. FPCs may be additionally or alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid electrical raft assembly (or assemblies)

600, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 6 and 7 has 6 conductive tracks 252 running through the substrate 255. However, the number of conductive tracks 252 running through a substrate 255 could be fewer than 6, or greater than 6. Indeed the number of conductive tracks 252 could be far greater than 6, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 6 and 7 comprises 2 layers of tracks, with each layer comprising 3 tracks 252.

An electrical raft 200 as described and claimed herein may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 8:
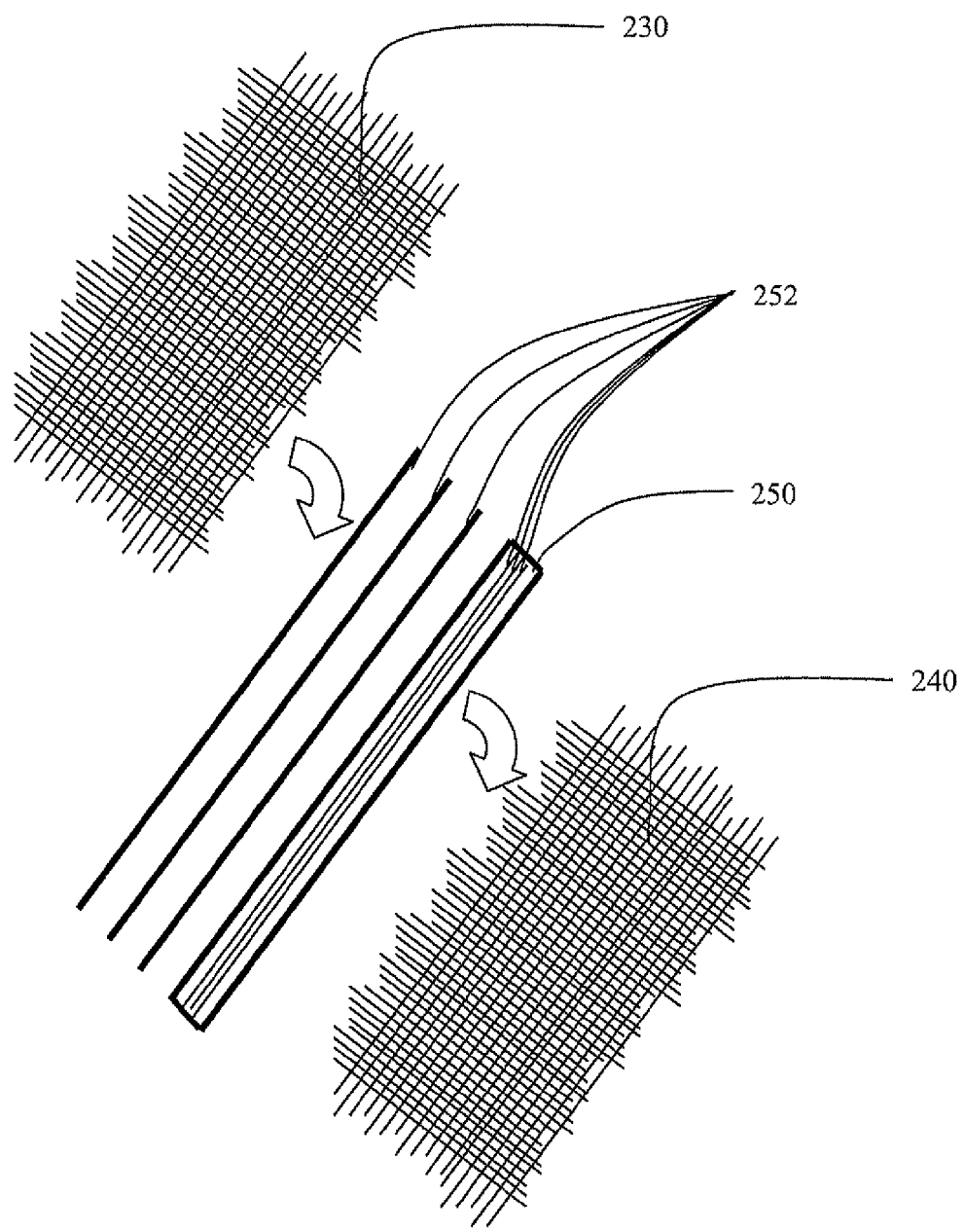
FIG. 8 shows a schematic of an electrical raft prior to assembly.

FIG. 8 shows components of an example of an electrical raft 200 prior to one method of construction. The electrical conductors 252 are provided between two layers of material 230, 240 that, after construction, form the rigid material 220. Some of the electrical conductors 252 are provided in an FPC 250. The material 230, 240 may be a fibre and resin compound, as described elsewhere herein. Such a fibre and resin compound may, after suitable treatment (for example heat treatment), produce the rigid composite material 220. In the example of FIG. 8, the fibre and resin compound is formed of a sheet of interwoven fibres, or strands. The strands in FIG. 8 extend in perpendicular directions, although the strands may extend in any one or more directions as required. The strands/fibres may be pre-impregnated (or "pre-pregged") with the resin.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions.

Any suitable method could be used to produce the electrical raft 200. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method. Indeed, in some constructions no fibre may be used at all in the rigid material 220.

After the treatment, the electrical raft 200 may be set in the desired shape. The electrical connectors 700 may be provided to the electrical raft 200 at any suitable time during manufacture, for example prior to any stiffening treatment of the rigid raft assembly 200, or after such treatment. For example, the or each connector 700 (together with any associated components, such as the protective shield 740 and/or the location feature 750) may be fixed (for example bonded) into an appropriate recess in the electrical raft. Such a recess may be formed using a correspondingly shaped mould, or may be formed (for example by machining or boring) after the rigid electrical raft is set. The first set of electrical contacts 710 of the or each electrical connector 700 may be electrically connected to one or more embedded electrical conductors 252 at this stage.

Alternatively, the electrical connector(s) 700 (together with any associated components, such as the protective shield 740 and/or the location feature 750) may be embedded directly into the electrical raft 200 during the forming and setting of the electrical raft 200. As such, the rigid material 220 may set around the electrical connector(s) 700, thereby fixing them into position. In this case, the electrical conductors 252 may be in electrical contact with the electrical connector(s) 700 prior to the rigid material 220 being set around them.

Figure 9:
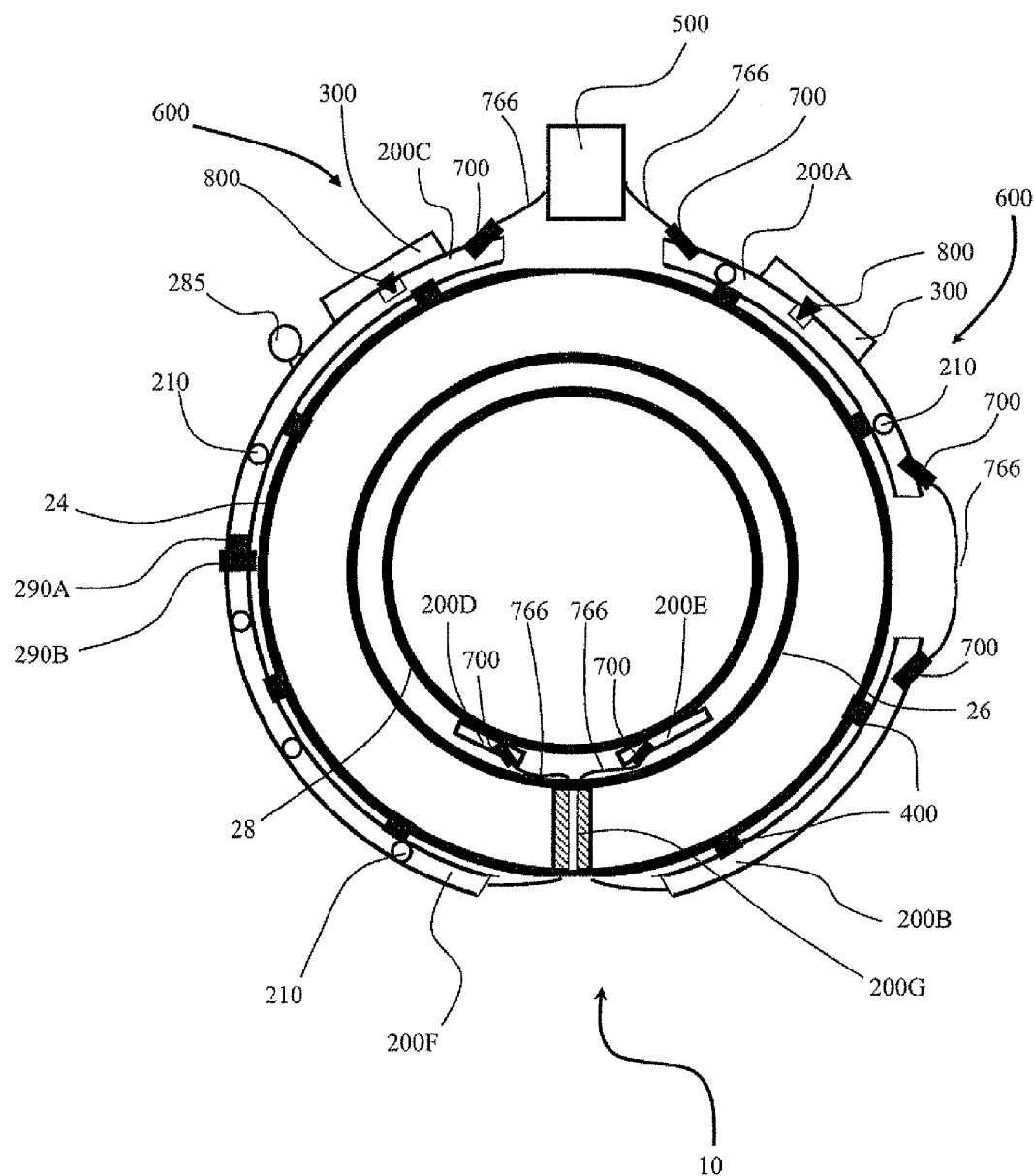
FIG. 9 shows a cross-section normal to the axial direction through a gas turbine engine according to an embodiment of the invention.

FIG. 9 is a schematic showing a cross-section perpendicular to the direction X-X of a gas turbine engine 10 comprising electrical rafts 200A-200G. FIG. 9 shows seven electrical rafts 200A-200G (which may be referred to collectively as electrical rafts 200).

Five of the electrical rafts 200A-200E comprise at least one electrical connector 700. These five electrical rafts 200A-200E may be in accordance with the electrical raft 200 described, for example, in relation to FIGS. 3 to 5, and the electrical connector(s) 700 may also be as described elsewhere herein, for example in relation to FIGS. 3 and 4.

Each of the five electrical rafts 200A-200E has a further electrical component (which may include an electrical conductor 766) attached thereto, each electrical raft 200A-200E thereby forming an electrical raft assembly 600 (as labelled in relation to rafts 200A and 2000, but not the other rafts to aid clarity of the Figure).

Each of the electrical rafts 200A-200G shown in FIG. 9 comprises one or more electrical conductors 252 as described elsewhere herein. However, any one or more of the electrical rafts 200A-200G may be replaced with a raft that does not comprise electrical conductors 252 (but not all of the electrical rafts 200A-200E). Such a raft would not be an electrical raft 200, but may otherwise be as described elsewhere herein, for example it may be a rigid raft that may have components/systems (such as, by way of example only, fluid systems, such as pipes) mounted thereon and/or embedded therein. Thus, for example, a gas turbine engine 10 in accordance with the present invention may have a combination of electrical rafts 200 and non-electrical rafts.

The arrangement of electrical rafts 200A-200G shown in FIG. 9 is by way of example only. Alternative arrangements, for example in terms of number, size, shape and/or positioning, of electrical rafts 200A-200G may be used. For example, there need not be 7 electrical rafts, the rafts may or may not be connected together, and/or the rafts could be provided to (for example mounted on) any one or more components of the gas turbine engine. Purely by way of example only, connection between electrical rafts 200A, 200B, 200C, 200F mounted on the fan casing 24 to the electrical rafts 200D, 200E mounted on the core casing 28 may be provided at least in part by means other than an additional electrical raft 200G, for example using wire conductors with insulating sleeves. By way of further example, one or more electrical rafts 200 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the electrical rafts 200A-200G may have a fluid passage 210 embedded therein. The fluid passage 210 may be part of a fluid system, such as a gas (for example pneumatic or cooling gas/air) and/or liquid (for example a fuel, hydraulic and/or lubricant liquid). In the FIG. 9 example, three of the electrical rafts 200A, 200C, 200F comprise a fluid passage 210 at least partially embedded therein. The electrical raft 200C also has a fluid passage (which may be for any fluid, such as those listed above in relation to embedded passage 210) mounted thereon. Such a mounted fluid passage 285 may be provided to any electrical raft, such as the electrical rafts 200A-200G shown in FIG. 9. The fluid passages 210, 285 may be oriented in an axial direction of the engine 10, as shown in FIG. 9. However, fluid passages may be oriented in any direction, for example axial, radial, circumferential or a combination thereof.

Two of the electrical rafts 200A, 200C in the FIG. 9 arrangement have electronic units 300 mounted thereon. The electronic control units 300 are electrically connected to the electrical rafts 200A, 200C via connections 800. At least a part of each connection 800 may be an electrical connection 700 provided to the respective electrical raft 200 at the mounting angle as described elsewhere herein. Alternatively, the connections between the electronic units 300 and the electrical raft 200A, 200C may take any other suitable form. It will be appreciated that electrical units 300 may be provided to any one or more electrical raft provided to an engine 10, such as the electrical rafts 200A-200G shown in FIG. 9.

In general, any electrical raft 200 may be provided with and/or may comprise (for example may have mounted on and/or have at least partially embedded therein) at least a part of any component and/or system of a gas turbine engine. Components/systems provided to different rafts 200 may be connected to each other, for example a component mounted on one raft 200 may be connected (for example directly electrically, mechanically and/or fluidly connected) to one or more components mounted on another raft 200.

The electrical rafts 200A-200G may be attached to the rest of the gas turbine engine 10 in any suitable manner. For example, as labelled explicitly in relation to electrical raft 200B, mounts 400, which may be anti-vibration mounts, may be used. Using anti-vibration mounts 400 may, for example, allow all components of the electrical raft 200 and/or electrical raft assembly 600 to be isolated from vibrations. Thus, components of at least two gas turbine engine systems may be vibration isolated using a single set of anti-vibration mounts 400.

The electrical rafts 200A, 200B, 200C, 200F are mounted to a fan case 24 in the example of FIG. 9. However, electrical rafts 200 such as those described by way of example herein may be provided/mounted anywhere on the engine 10. For example, one or more electrical raft 200D, 200E may be mounted between an engine core casing 28 and an engine core fairing 26. Also by way of example, one or more electrical raft 200G may be provided as at least a part of (for example in) a passage across the bypass duct 22, such as a bifurcation or splitter. In other respects, the electrical rafts mounted anywhere on the engine may be as described elsewhere herein, or otherwise in accordance with the invention. Although only five of the electrical rafts 200A-200E are shown as comprising an electrical connector 700 provided at a mounting angle as described herein, any one of the electrical rafts 200A-200G shown in FIG. 9 may comprise such an electrical connector 700, and thus may be in accordance with the invention.

Any of the electrical rafts 200A-200G (or non-electrical rafts in an arrangement where at least one the of rafts does not have electrical conductors 252) may have any combination of mechanical, electrical and/or fluid connections to one or more (for example 2, 3, 4, 5 or more than 5) other components/systems of the gas turbine engine 10 and/or the rest of the gas turbine engine 10 itself. Examples of such connections are shown in FIG. 9, and described below, but it will be appreciated that a gas turbine engine 10 including electrical rafts 200 may have connections that are different to those shown in FIG. 9, although at least one of the electrical rafts 200 has an electrical connector 700 mounted at a mounting angle in the range described herein. For example, electrical rafts 200 (and/or non-electrical rafts) may be connected together (or to other components) using any combination of electrical, fluid and/or mechanical connectors. Thus, any of the electrical connections 290A/290B, 766 shown in FIG. 9 may be any combination of electrical, fluid and/or mechanical connection. Alternatively, electrical rafts (and/or non-electrical rafts) may have no connection to other rafts or components.

A connection 766 is shown between the electrical rafts 200A and 200B. The connection 766 comprises an electrical connection. Such an electrical connection may be flexible and may, for example, take the form of a flexible printed circuit such as the flexible printed circuit 250 shown in FIGS. 6 and 7. The electrical connection 766 may be part of a further electrical component 760 that is electrically connected to the second set of electrical contacts 720 of the electrical connector 700, for example as described herein in relation to FIGS. 3 and 4 in particular. Such a flexible electrical connection 766 may be used to electrically connect any electrical raft 200 to any other component, such as another electrical raft 200. Further, similar, electrical connections 766 are provided between the electrical rafts 200A, 200C and a part of an airframe, or airframe installation 500, which may, for example, be a pylon. Similarly, an electrical connection 766 (extending from a respective electrical connector 700) is provided between each of the rafts 200D, 200E mounted between the engine core casing 28 and the engine core fairing 26 and the electrical raft 200G provided in the engine bifurcation or splitter.

Each of the rafts 200A-200E in FIG. 9 that is provided with an electrical connector 700 at a mounting angle described herein, and is thus in accordance with the invention, is connected to a further electrical component in the form of one or more electrical conductors 766. However, the further electrical component that is connected to the electrical connector 700 may be of any type, for example any type of ECU, as described elsewhere herein. Thus, it will be appreciated that the further electrical components attached to the electrical connectors 700 of the electrical rafts 200A-200E are by way of example only.

A direct connection 290A, 290B is provided between the electrical rafts 200B and 200C in the FIG. 9 arrangement. Such a direct connection 290A, 290B may comprise a connector 290A provided on (for example embedded in) one electrical raft 200C connected to a complimentary connector 290B provided on (for example embedded in) another electrical raft 200B. Such a direct connection 290A, 290B may, for example, provide fluid and/or electrical connection between the two electrical rafts 200B, 200C.

Where reference is made herein to an engine or a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term 'gas turbine engine' as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical rafts 200 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

It will be appreciated that many alternative configurations and/or arrangements of electrical rafts 200 and gas turbine engines 10 comprising electrical rafts 200 other than those described herein may fall within the scope of the invention. For example, alternative arrangements of electrical rafts 200 (for example in terms of the arrangement/shape/positioning/construction of the electrical rafts 200, the type and/or positioning of components (if any) mounted to/embedded in the electrical rafts 200, the rigid material 220 and the electrical conductors 252) may fall within the scope of the invention and may be readily apparent to the skilled person from the disclosure provided herein. Alternative arrangements of connections (for example mechanical, electrical and/or fluid) between the electrical (or non-electrical) rafts and between the electrical (or non-electrical) rafts and other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. An electrical raft installed in a gas turbine engine, the electrical raft comprising:
    a rigid material having multiple electrical conductors embedded therein; and
    an electrical connector comprising a housing that is distinct from and mounted in the rigid material, the housing having a first end and a second end, with a first set of electrical contacts being at the first end and a second set of electrical contacts being at the second end, the first set of electrical contacts connected to at least one of the electrical conductors, and the second set of electrical contacts for electrical connection to a component, wherein:
    the electrical raft is installed in the gas turbine engine and has a first major surface separated by a thickness from a second major surface, the first major surface configured to receive the housing within; and
    the electrical connector housing is mounted in the rigid material so as to form a mounting angle in the range of from 20 degrees to 70 degrees with the first major surface, such that the second set of electrical contacts are accessible from outside the electrical raft, thereby allowing the electrical raft to be electrically connected to said component.

2. The electrical raft according to claim 1, wherein the second set of electrical contacts are aligned with the electrical connector so as to also be at the mounting angle relative to the first major surface.

3. The electrical raft according to claim 1, wherein the first set of electrical contacts are aligned with the electrical connector so as to also be at the mounting angle relative to the first major surface.

4. The electrical raft according to claim 1, wherein at least some of the electrical conductors are permanently fixed to the first set of electrical contacts.

5. The electrical raft according to claim 1, wherein the electrical conductors that are connected to the first set of electrical contacts turn through an angle equal to the mounting angle in order to be connected to the first set of electrical contacts.

6. The electrical raft according to claim 1, wherein:
    at least some of the electrical conductors are provided in a flexible printed circuit in the form of electrical tracks formed in a flexible substrate;
    the electrical tracks terminate in openings in a flexible printed circuit connector; and
    the first set of electrical contacts comprise pins that are received in respective openings so as to electrically connect the electrical tracks to the electrical connector.

7. The electrical raft according to claim 6, wherein the electrical conductors provided in the flexible printed circuit turn through an angle equal to 90 degrees minus the mounting angle before terminating in the openings in the flexible printed circuit connector.

8. The electrical raft according to claim 1, further comprising a protective shield located between at least a part of the electrical connector and the rigid material of the electrical raft.

9. The electrical raft according to claim 1, further comprising a location feature in contact with the electrical connector so as to mount the electrical connector at the orientation required for it to form the mounting angle with the first surface.

10. The electrical raft according to claim 1, further comprising an electrically conductive screen layer.

11. The electrical raft according to claim 1, wherein the mounting angle is in the range of from 30 degrees to 60 degrees.

12. The electrical raft according to claim 1, wherein the rigid material is a rigid composite material.

13. An electrical raft assembly comprising:
the electrical raft according to claim 1; and
an electrical component comprising a complimentary set of electrical contacts that correspond to the second set of electrical contacts, wherein
the electrical raft and the electrical component are in electrical connection through the second set of electrical contacts and the complimentary set of electrical contacts.

14. The gas turbine engine according to claim 1, wherein the electrical raft is a first engine installation component, and the gas turbine engine further comprises:
a second engine installation component having electrical conductors; and
at least one flexible cable connected between the electrical raft and the second engine installation component so as to electrically connect electrical conductors of the electrical raft with electrical conductors of the second engine installation component.

15. A method of manufacturing a gas turbine engine comprising:
attaching the electrical raft according to claim 1 to a gas turbine engine; and
electrically connecting an electrical component of the gas turbine engine to the electrical raft by connecting the second set of contacts to a complimentary set of contacts of the electrical component.

16. The electrical raft according to claim 1, wherein the mounting angle is in the range of from 40 degrees to 50 degrees.

17. The electrical raft according to claim 1, wherein the mounting angle is 45 degrees.

* * * * *